(12) United States Patent
Taguchi

(10) Patent No.: US 9,917,047 B2
(45) Date of Patent: Mar. 13, 2018

(54) WIRING BOARD

(71) Applicant: KYOCERA Corporation, Kyoto-shi, Kyoto (JP)

(72) Inventor: Takayuki Taguchi, Kusatsu (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/460,725

(22) Filed: Mar. 16, 2017

(65) Prior Publication Data

US 2017/0278781 A1 Sep. 28, 2017

(30) Foreign Application Priority Data

Mar. 23, 2016 (JP) .................................. 2016-058263

(51) Int. Cl.
*H05K 1/11* (2006.01)
*H01L 23/498* (2006.01)

(52) U.S. Cl.
CPC .. *H01L 23/49838* (2013.01); *H01L 23/49822* (2013.01); *H01L 23/49827* (2013.01)

(58) Field of Classification Search
CPC ... H05K 1/02; H05K 1/11; H05K 3/12; H05K 3/46
USPC ........ 174/264, 251, 261; 257/773, 774, 782; 427/97.4, 98.4
See application file for complete search history.

(56) References Cited

U.S. PATENT DOCUMENTS

| 5,841,190 A * | 11/1998 | Noda ................... H01L 23/3107 257/668 |
| 2002/0149098 A1* | 10/2002 | Seyama .................. H01L 23/10 257/686 |
| 2006/0138591 A1* | 6/2006 | Amey, Jr. ......... H01L 23/49822 257/532 |

(Continued)

FOREIGN PATENT DOCUMENTS

| JP | 2008-004579 A | 1/2008 |
| TW | 201523834 A | 6/2015 |
| TW | 201611215 A | 3/2016 |

OTHER PUBLICATIONS

Taiwanese Office Action with English concise explanation, Taiwan Patent Application No. 106109332, dated Nov. 17, 2017, 6 pgs.

*Primary Examiner* — Xiaoliang Chen
(74) *Attorney, Agent, or Firm* — Volpe and Koenig, P.C.

(57) ABSTRACT

A wiring board of the present disclosure includes a core substrate, insulating layers, signal wiring conductors, ground wiring conductors, power-supply wiring conductors, a first mounting portion on which a first semiconductor device is to be mounted, a second mounting portion on which a second semiconductor device is to be mounted, many first-semiconductor-device connection pads connectable to signal electrodes of the first semiconductor device, many second-semiconductor-device connection pads connectable to signal electrodes of the second semiconductor device, and many signal connection conductors that connect the first-semiconductor-device connection pads to the second-semiconductor-device connection pads. The signal connection conductors include signal connection conductors of a first wiring group that extend only through a region above the top surface of the core substrate, and signal connection conductors of a second wiring group that extend through a region below the bottom surface of the core substrate.

5 Claims, 1 Drawing Sheet

(56) References Cited

U.S. PATENT DOCUMENTS

| | | | |
|---|---|---|---|
| 2006/0192282 A1* | 8/2006 | Suwa | H01L 23/50 257/723 |
| 2008/0143379 A1* | 6/2008 | Norman | H01L 23/50 326/39 |
| 2013/0256000 A1* | 10/2013 | Terui | H05K 1/0298 174/251 |
| 2014/0332966 A1* | 11/2014 | Xiu | H01L 23/293 257/773 |
| 2014/0360759 A1* | 12/2014 | Kunieda | H01L 23/5384 174/251 |
| 2014/0360767 A1* | 12/2014 | Terui | H01L 24/19 174/261 |
| 2015/0001733 A1* | 1/2015 | Karhade | H01L 23/538 257/774 |
| 2015/0155256 A1 | 6/2015 | Lin et al. | |
| 2016/0079136 A1 | 3/2016 | Chiu et al. | |

* cited by examiner

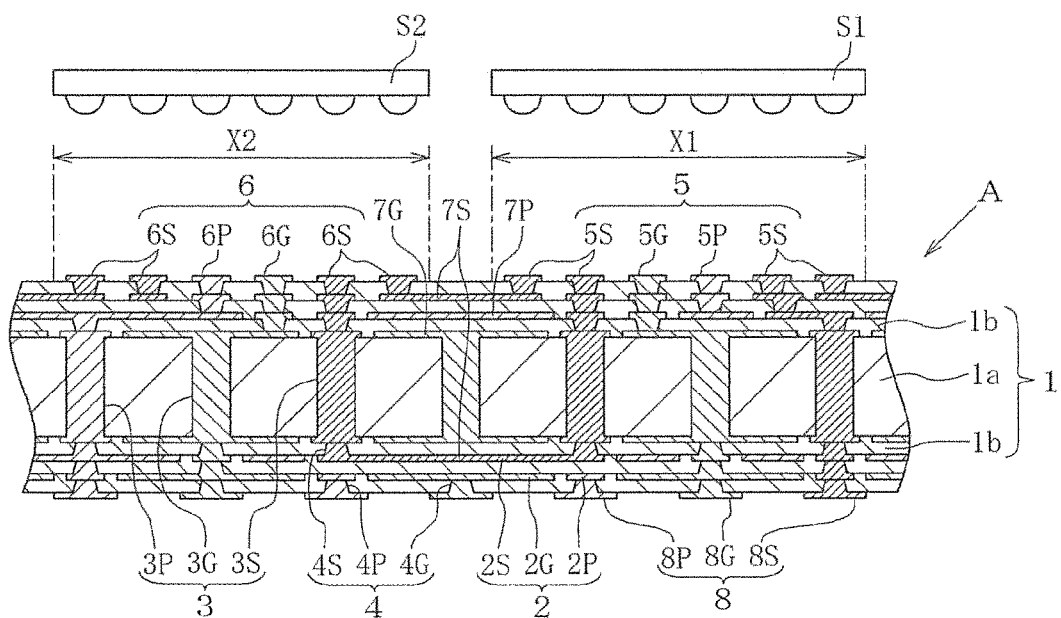

WIRING BOARD

BACKGROUND OF THE INVENTION

1. Technical Field

The present disclosure relates to a wiring board on which a plurality of semiconductor devices is mounted.

2. Background

In recent years, electronic devices, such as portable game devices and communication devices, have become smaller and more functional. Accordingly, there has been a demand for smaller and more functional wiring boards for use in the electronic devices. To satisfy such a demand, a plurality of semiconductor devices having many arithmetic systems are arranged close to each other on a wiring board, and are connected to each other by densely arranged wiring conductors. Japanese Unexamined Patent Application Publication No. 2008-4579, for example, describes a known wiring board on which a plurality of semiconductor devices is mounted.

SUMMARY OF THE INVENTION

A wiring board according to the present disclosure includes a core substrate comprising a plurality of through holes; a plurality of insulating layers stacked on a top surface of the core substrate and a plurality of insulating layers stacked on a bottom surface of the core substrate, each insulating layer comprising a plurality of via holes; signal wiring conductors, ground wiring conductors, and power-supply wiring conductors disposed on surfaces of the core substrate, in the through holes, on surfaces of the insulating layers, and in the via holes; a first mounting portion that is disposed on a surface of a topmost one of the insulating layers and on which a first semiconductor device is to be mounted; a second mounting portion that is adjacent to the first mounting portion and on which a second semiconductor device is to be mounted; many first-semiconductor-device signal connection pads that are disposed on the first mounting portion and that are connectable to signal electrodes of the first semiconductor device; many second-semiconductor-device signal connection pads that are disposed on the second mounting portion and that are connectable to signal electrodes of the second semiconductor device; and many signal connection conductors comprising some of the signal wiring conductors and electrically connecting the first-semiconductor-device signal connection pads to the second-semiconductor-device signal connection pads corresponding to the first-semiconductor-device signal connection pads. The signal connection conductors comprise signal connection conductors of a first wiring group that extend only along the surfaces of the insulating layers above the core substrate via the via holes, and signal connection conductors of a second wiring group that extend along the surfaces of the insulating layers below the core substrate via the through holes and the via holes.

BRIEF DESCRIPTION OF THE DRAWING

FIG. 1 is a schematic sectional view of a part of a wiring board according to an embodiment of the present disclosure.

DETAILED DESCRIPTION

A wiring board A according to an embodiment of the present disclosure will be described with reference to FIG. 1. FIG. 1 is a schematic sectional view of a part of the wiring board A in a region around semiconductor devices that are arranged close to each other on the wiring board A. The wiring board A according to the present disclosure includes an insulating substrate 1 and wiring conductors 2.

The insulating substrate 1 is formed by stacking build-up insulating layers 1b on top and bottom surfaces of a core substrate 1a. The core substrate 1a includes a plurality of through holes 3. The through holes 3 include signal through holes 3S, power-supply through holes 3P, and ground through holes 3G. The through holes 3 have a diameter of about 50 to 300 μm, and are formed by, for example, blasting or drilling.

Each build-up insulating layer 1b includes a plurality of via holes 4. The via holes 4 include signal via holes 4S, power-supply via holes 4P, and ground via holes 4G. The via holes 4 have a diameter of about 50 to 100 μm, and is formed by, for example, laser processing.

The core substrate 1a and insulating layers 1b are made of, for example, a thermosetting resin such as an epoxy resin or bismaleimide-triazine resin. A first mounting portion X1, on which a first semiconductor device S1 is to be mounted, and a second mounting portion X2, on which a second semiconductor device S2 is to be mounted, are arranged adjacent to each other on the top surface of the insulating substrate 1.

The wiring conductors 2 are disposed on the surfaces of the core substrate 1a, in the through holes 3, on the surfaces of the insulating layers 1b, and in the via holes 4. The wiring conductors 2 include signal wiring conductors 2S, power-supply wiring conductors 2P, and ground wiring conductors 2G. The signal wiring conductors 2S have many strip-shaped patterns disposed on the surfaces of the insulating layers 1b. The power-supply wiring conductors 2P and the ground wiring conductors 2G have planar patterns that are spaced from the signal wiring conductors 2S by a predetermined distance on the surfaces of the same insulating layers 1b and planar patterns that are disposed on the surfaces of the insulating layers 1b above or below the insulating layers 1b on which the signal wiring conductors 2S are disposed. The wiring conductors 2 are formed by, for example, the "semi-additive method" or "subtractive method", which are commonly known, by using a highly conductive metal such as copper plating.

Some of the wiring conductors 2 serve as many first-semiconductor-device connection pads 5 in the first mounting portion X1. The first-semiconductor-device connection pads 5 include first-semiconductor-device signal connection pads 5S, first-semiconductor-device power-supply connection pads 5P, and first-semiconductor-device ground connection pads 5G. The first-semiconductor-device signal connection pads 5S are connectable to signal electrodes of the first semiconductor device S1. The first-semiconductor-device power-supply connection pads 5P are connectable to a power-supply electrode of the first semiconductor device S1. The first-semiconductor-device ground connection pads 5G are connectable to a ground electrode of the first semiconductor device S1.

Some of the wiring conductors 2 server as many second-semiconductor-device connection pads 6 in the second mounting portion X2. The second-semiconductor-device connection pads 6 include second-semiconductor-device signal connection pads 6S, second-semiconductor-device power-supply connection pads 6P, and second-semiconductor-device ground connection pads 6G. The second-semiconductor-device signal connection pads 6S are connectable to signal electrodes of the second semiconductor device S2. The second-semiconductor-device power-supply connection pads 6P are connectable to a power-supply electrode of the second semiconductor device S2. The second-semiconductor-device ground connection pads 6G are connectable to a ground electrode of the second semiconductor device S2.

The first-semiconductor-device connection pads 5 are connected to the corresponding second-semiconductor-device connection pads 6 by some of the wiring conductors 2. More specifically, the first-semiconductor-device signal connection pads 5S are connected to the second-semiconductor-device signal connection pads 6S by many signal connection conductors 7S, which are composed of the signal wiring conductors 2S having the strip-shaped patterns. The first-semiconductor-device power-supply connection pads 5P are connected to the second-semiconductor-device power-supply connection pads 6P by power-supply connection conductors 7P, which are composed of the power-supply wiring conductors 2P having the planar patterns. The first-semiconductor-device ground connection pads 5G are connected to the second-semiconductor-device ground connection pads 6G by ground connection conductors 7G, which are composed of the ground wiring conductors 2G having the planar pattern.

The first-semiconductor-device signal connection pads 5S and the second-semiconductor-device signal connection pads 6S are classified into, for example, 40 systems in accordance with the arithmetic systems for the first and second semiconductor devices S1 and S2. The number of pads for each system is about 50. The first-semiconductor-device signal connection pads 5S and the second-semiconductor-device signal connection pads 6S that belong to the same system are connected to each other by about 50 signal connection conductors 7S.

The signal connection conductors 7S of half of the arithmetic systems belong to a first wiring group, and the signal connection conductors 7S of the remaining half of the arithmetic systems belong to a second wiring group. The signal connection conductors 7S of the first wiring group extend only along the surfaces of the insulating layers 1b above the core substrate 1a via the signal via holes 4S. The signal connection conductors 7S of the second wiring group extend along the surfaces of the insulating layers 1b below the core substrate 1a via the signal through holes 3S and the signal via holes 4S.

When the signal through holes 3S are arranged adjacent to each other, one of the ground through holes 3G is preferably disposed between the adjacent signal through holes 3S. This arrangement reduces noise interference between the signal through holes 3S.

A plurality of external connection pads 8 is disposed on the bottom surface of the insulating substrate 1. The external connection pads 8 are composed of some of the wiring conductors on the bottom surface of the insulating substrate 1. The external connection pads 8 include signal external connection pads 8S, power-supply external connection pads 8P, and ground external connection pads 8G. Wiring conductors of an external circuit board are connectable to the external connection pads 8 by solder. Thus, the first and second semiconductor devices S1 and S2 are electrically connected to the external circuit board.

Assume that, for example, all of the signal connection conductors 7S that electrically connect the first-semiconductor-device signal connection pads 5S to the second-semiconductor-device signal connection pads 6S are disposed on the surfaces of the insulating layers 1b above the core substrate 1a. There are about 2000 first-semiconductor-device signal connection pads 5S and about 2000 second-semiconductor-device signal connection pads 6S, and therefore the number of signal connection conductors 7S that connect them is also about 2000. Accordingly, a large number of insulating layers 1b need to be disposed above the core substrate 1a to form the signal connection conductors 7S.

To reduce warping of the wiring board by arranging the same number of insulating layers above and below the core substrate 1a and ensuring good balance in the vertical direction, it is also necessary to arrange a large number of insulating layers 1b below the core substrate 1a.

As a result, the number of layers of the wiring board is increased, and it is difficult to reduce the thickness of the wiring board.

In contrast, in the wiring board A according to the present disclosure, the signal connection conductors 7S that connect the first-semiconductor-device signal connection pads 5S to the second-semiconductor-device signal connection pads 6S are divided into the first wiring group and the second wiring group; the signal connection conductors 7S of the first wiring group extend only along the surfaces of the insulating layers 1b above the core substrate 1a via the signal via holes 4S, and the signal connection conductors 7S of the second wiring group extend along the surfaces of the insulating layers 1b on the bottom surface of the core substrate 1a via the through holes 3S and the via holes 4S. Accordingly, the number of insulating layers 1b above the core substrate 1a can be reduced by the number of insulating layers 1b below the core substrate 1a along which the signal connection conductors 7S of the second wiring group extend. Moreover, the number of insulating layers 1b disposed below the core substrate 1a so as to be balanced with the insulating layers 1b above the core substrate 1a can also be reduced. Accordingly, a wiring board that can be reduced in thickness by reducing the number of insulating layers 1b can be provided.

The present disclosure is not limited to the above-described embodiment, and various modifications and improvements are possible within the scope of the claims. For example, although two mounting portions, that is, the first and second mounting portions X1 and X2 on which the first and second semiconductor devices S1 and S2 are mounted, are provided in the above-described embodiment, the number of mounting portions may instead be three or more.

What is claimed is:
1. A wiring board comprising:
a core substrate comprising a plurality of through holes;
a plurality of insulating layers stacked on a top surface of the core substrate and a plurality of insulating layers stacked on a bottom surface of the core substrate, each insulating layer comprising a plurality of via holes;
signal wiring conductors, ground wiring conductors, and power-supply wiring conductors disposed on surfaces of the core substrate, in the through holes, on surfaces of the insulating layers, and in the via holes;
a first mounting portion that is disposed on a surface of a topmost one of the insulating layers and on which a first semiconductor device is to be mounted;
a second mounting portion that is adjacent to the first mounting portion and on which a second semiconductor device is to be mounted;
many first-semiconductor-device signal connection pads that are disposed on the first mounting portion and that are connectable to signal electrodes of the first semiconductor device;
many second-semiconductor-device signal connection pads that are disposed on the second mounting portion and that are connectable to signal electrodes of the second semiconductor device; and many signal connection conductors comprising some of the signal wiring conductors and electrically connecting the first-semiconductor-device signal connection pads to the second-semiconductor-device signal connection pads corresponding to the first-semiconductor-device signal connection pads, wherein the signal connection conductors comprise signal connection conductors of a first wiring group that extend only along the surfaces of the insulating layers above the core substrate via the via holes, and signal connection conductors of a second wiring group that extend along the surfaces of the insulating layers below the core substrate via the through holes and the via holes.

2. The wiring board according to claim 1, wherein one of the through holes in which the ground wiring conductors are disposed is disposed between two of the through holes via which the signal connection conductors extend.

3. The wiring board according to claim 1, wherein half of the signal connection conductors belong to the first wiring group, and the remaining half of the signal connection conductors belong to the second wiring group.

4. The wiring board according to claim 1, wherein the through holes have a diameter in a range of 50 to 300 μm.

5. The wiring board according to claim 1, wherein the via holes have a diameter in a range of 50 to 100 μm.

* * * * *